(12) United States Patent
Kim et al.

(10) Patent No.: US 11,562,939 B2
(45) Date of Patent: Jan. 24, 2023

(54) SEMICONDUCTOR PACKAGE INCLUDING HEAT SPREADER LAYER

(71) Applicant: Samsung Electronics Co., Ltd., Suwon-si (KR)

(72) Inventors: Jingu Kim, Suwon-si (KR); Sangkyu Lee, Suwon-si (KR); Yongkoon Lee, Suwon-si (KR); Seokkyu Choi, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/235,502

(22) Filed: Apr. 20, 2021

(65) Prior Publication Data
US 2022/0102236 A1    Mar. 31, 2022

(30) Foreign Application Priority Data
Sep. 29, 2020 (KR) ........................ 10-2020-0127014

(51) Int. Cl.
| | |
|---|---|
| *H01L 23/367* | (2006.01) |
| *H01L 23/31* | (2006.01) |
| *H01L 23/538* | (2006.01) |
| *H01L 25/10* | (2006.01) |
| *H01L 23/00* | (2006.01) |

(52) U.S. Cl.
CPC ........ *H01L 23/367* (2013.01); *H01L 23/3128* (2013.01); *H01L 23/5383* (2013.01); *H01L 23/5386* (2013.01); *H01L 23/5389* (2013.01); *H01L 24/20* (2013.01); *H01L 25/105* (2013.01); *H01L 2224/214* (2013.01); *H01L 2225/1035* (2013.01); *H01L 2225/1052* (2013.01); *H01L 2225/1058* (2013.01); *H01L 2225/1094* (2013.01)

(58) Field of Classification Search
CPC ............... H01L 23/367; H01L 23/3128; H01L 23/5383; H01L 23/5386; H01L 23/5389; H01L 24/20; H01L 25/105; H01L 2224/214; H01L 2225/1035; H01L 2225/1052; H01L 2225/1058; H01L 2225/1094
See application file for complete search history.

(56) References Cited

U.S. PATENT DOCUMENTS

| | | | |
|---|---|---|---|
| 6,812,548 | B2 | 11/2004 | Dias et al. |
| 7,492,041 | B2 | 2/2009 | Ravi et al. |
| 8,432,022 | B1 | 4/2013 | Huemoeller et al. |
| 9,431,316 | B2 | 8/2016 | Pagaila |

(Continued)

FOREIGN PATENT DOCUMENTS

JP     2014086660 A     5/2014

*Primary Examiner* — Fernando L Toledo
*Assistant Examiner* — Neil R Prasad
(74) *Attorney, Agent, or Firm* — Muir Patent Law, PLLC

(57) ABSTRACT

A semiconductor package includes a connection layer, a semiconductor chip disposed at a center portion of the connection layer, an adhesive layer disposed on the semiconductor chip, a heat spreader layer disposed on the adhesive layer, and a lower redistribution layer disposed on the connection layer and a bottom surface of the semiconductor chip. A width of the adhesive layer is the same as a width of the semiconductor chip, and a width of the heat spreader layer is less than the width of the adhesive layer.

20 Claims, 14 Drawing Sheets

(56) References Cited

U.S. PATENT DOCUMENTS

| | | | |
|---|---|---|---|
| 9,443,828 B2 | 9/2016 | Pagaila et al. | |
| 2008/0246130 A1* | 10/2008 | Carney | H01L 23/49568 |
| | | | 257/E23.101 |
| 2008/0298021 A1* | 12/2008 | Ali | H01L 23/3732 |
| | | | 361/679.48 |
| 2009/0108437 A1* | 4/2009 | Raymond | H01L 23/3735 |
| | | | 257/713 |
| 2014/0077394 A1* | 3/2014 | Chang | H01L 23/4334 |
| | | | 257/782 |
| 2019/0139853 A1* | 5/2019 | Oh | H01L 23/16 |
| 2019/0267344 A1 | 8/2019 | Seddon et al. | |
| 2020/0013707 A1 | 1/2020 | Jeng et al. | |
| 2021/0183722 A1* | 6/2021 | Anderson | H01L 21/568 |

\* cited by examiner

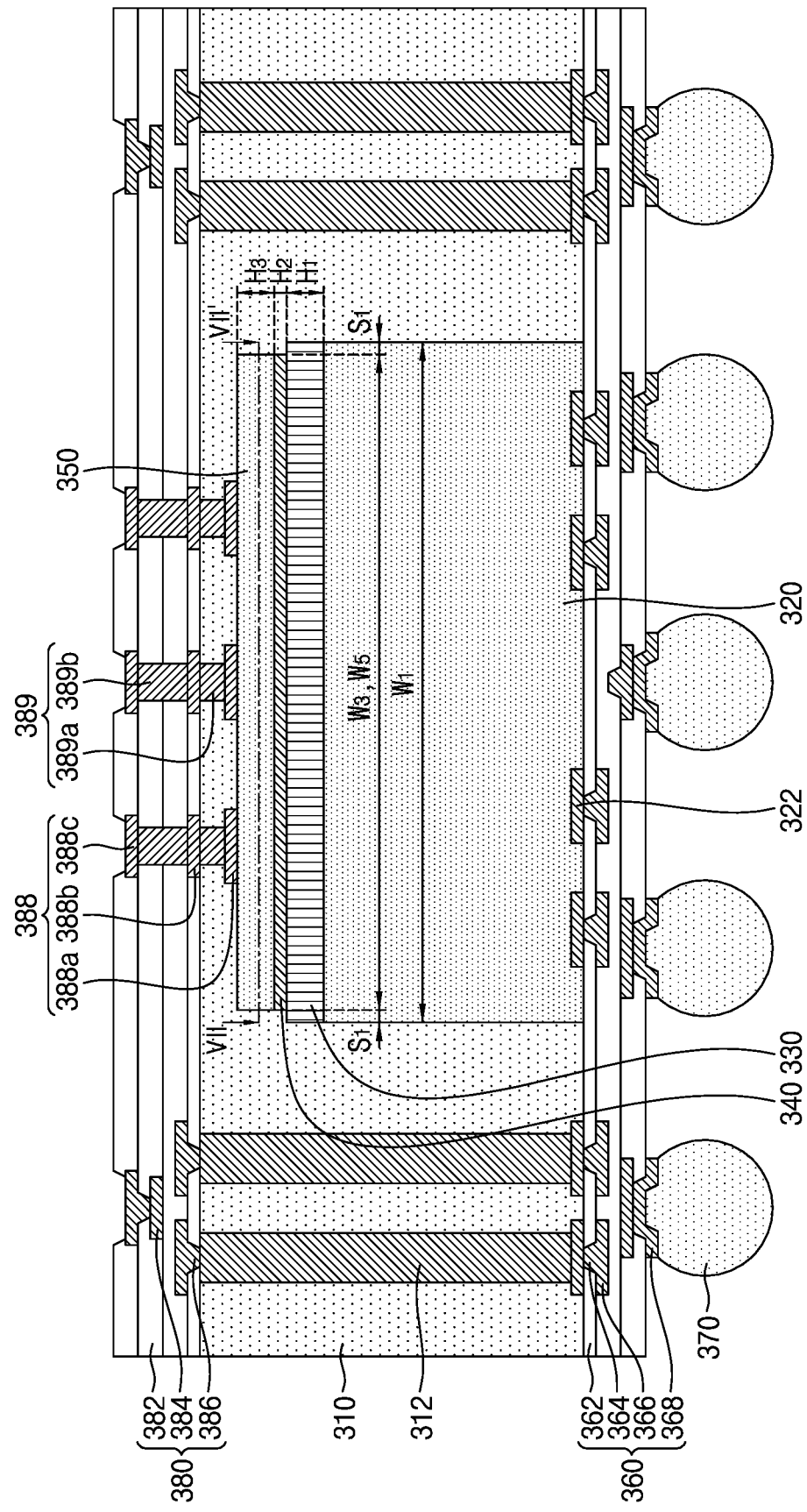

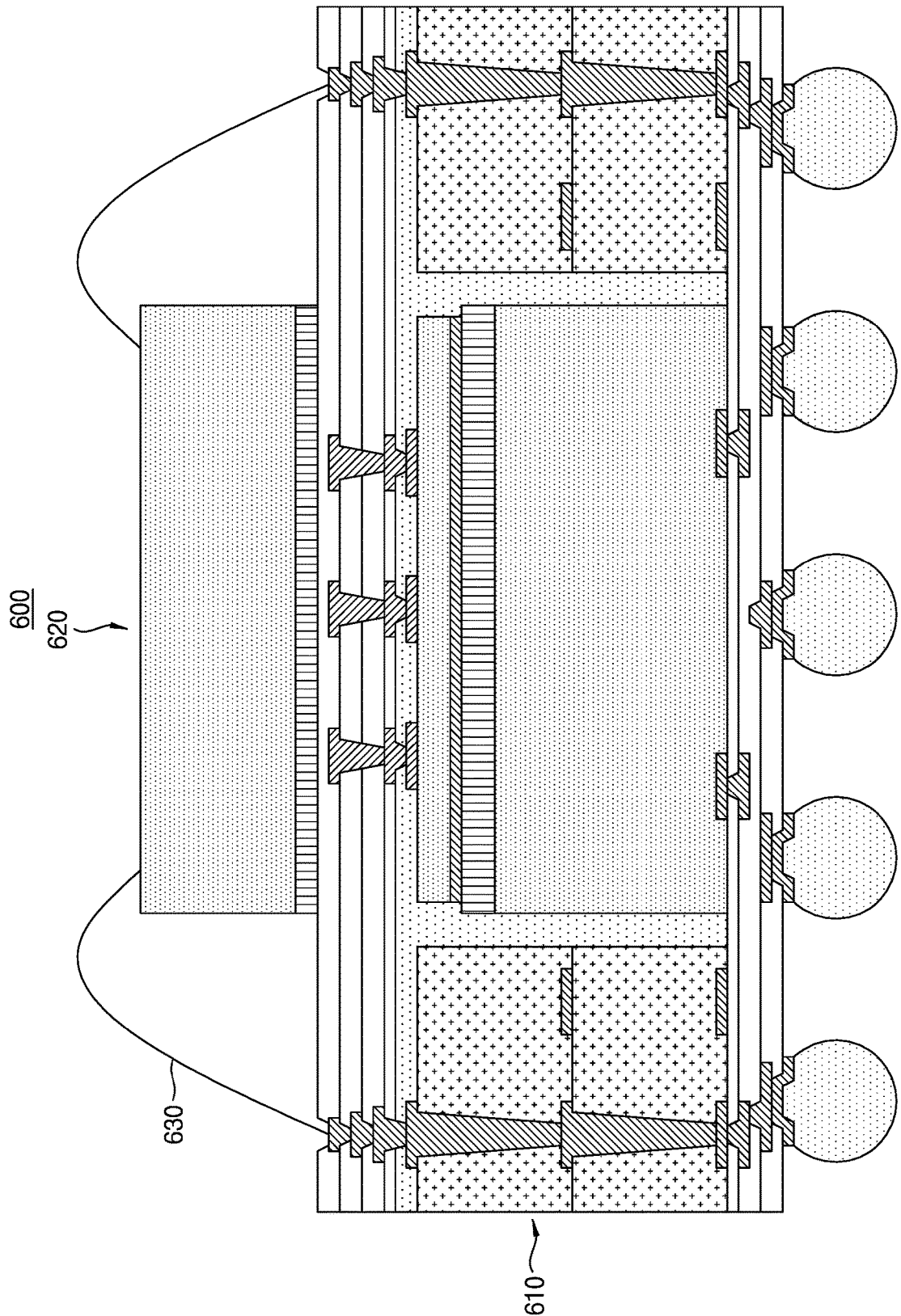

US 11,562,939 B2

SEMICONDUCTOR PACKAGE INCLUDING HEAT SPREADER LAYER

CROSS-REFERENCE TO THE RELATED APPLICATION

This application claims priority under 35 U.S.C. § 119 to Korean Patent Application No. 10-2020-0127014, filed on Sep. 29, 2020, in the Korean Intellectual Property Office, the disclosure of which is incorporated herein by reference in its entirety.

BACKGROUND

1. Field

The inventive concept relates to a semiconductor package, and particularly, to a semiconductor package including a heat spreader layer.

2. Description of the Related Art

As highly-integrated and miniaturized semiconductor devices are needed, a size of each semiconductor device is progressively reduced. Also, semiconductor packages need to process massive data. Accordingly, semiconductor packages include a plurality of semiconductor chips molded therein.

As semiconductor devices are highly integrated and progressively enhanced in performance, heat to be dissipated may excessively occur in semiconductor devices. Thermal interface materials (TIM) may be disposed in semiconductor packages so as to dissipate heat, but may be difficult to be applied to mobile devices requiring small-volume semiconductor packages.

SUMMARY

The exemplary embodiments of the disclosure provide a semiconductor package which effectively dissipates heat occurring in a semiconductor device.

A semiconductor package in accordance with an embodiment of the disclosure may include a connection layer, a semiconductor chip disposed at a center portion of the connection layer, an adhesive layer disposed on the semiconductor chip, a heat spreader layer disposed on the adhesive layer, and a lower redistribution layer disposed on the connection layer and a bottom surface of the semiconductor chip, wherein a width of the adhesive layer may be the same as a width of the semiconductor chip, and a width of the heat spreader layer may be less than the width of the adhesive layer.

A semiconductor package in accordance with an embodiment of the disclosure may include a connection layer, a semiconductor chip surrounded by the connection layer, an adhesive layer disposed on the semiconductor chip, a plurality of heat spreader layers disposed on the adhesive layer, and a lower redistribution layer disposed on the connection layer and a bottom surface of the semiconductor chip, wherein a width of the adhesive layer may be the same as a width of the semiconductor chip, a width of each of the plurality of heat spreader layers may be less than a width of the adhesive layer, and the plurality of heat spreader layers may be arranged in a lattice pattern.

A semiconductor package in accordance with an embodiment of the disclosure may include a semiconductor chip, an adhesive layer disposed on the semiconductor chip, a thin film layer disposed on the adhesive layer, a heat spreader layer disposed on the thin film layer, an encapsulant covering the semiconductor chip, the adhesive layer, and the heat spreader layer, a lower redistribution layer disposed on a bottom surface of the semiconductor chip and a bottom surface of the encapsulant, the lower redistribution layer including an insulation layer and a wiring pattern, an upper redistribution layer disposed on the encapsulant, a conductive via connecting the lower redistribution layer to the upper redistribution layer, an external connection terminal disposed on a bottom surface of the lower redistribution layer and electrically connected to the semiconductor chip and the conductive via through the wiring pattern, and a heat dissipation via passing through the encapsulant and the upper redistribution layer and vertically overlapping the heat spreader layer, wherein a width of the adhesive layer may be the same as a width of the semiconductor chip, a width of the thin film layer may be less than a width of the adhesive layer and may be the same as a width of the heat spreader layer.

BRIEF DESCRIPTION OF THE DRAWINGS

FIGS. 7A and 7B are vertical cross-sectional views of a semiconductor package according to an embodiment of the disclosure.

FIG. 12 is a vertical cross-sectional view of a semiconductor package according to an embodiment of the disclosure.

DETAILED DESCRIPTION OF EXEMPLARY EMBODIMENTS

Figure 1A:
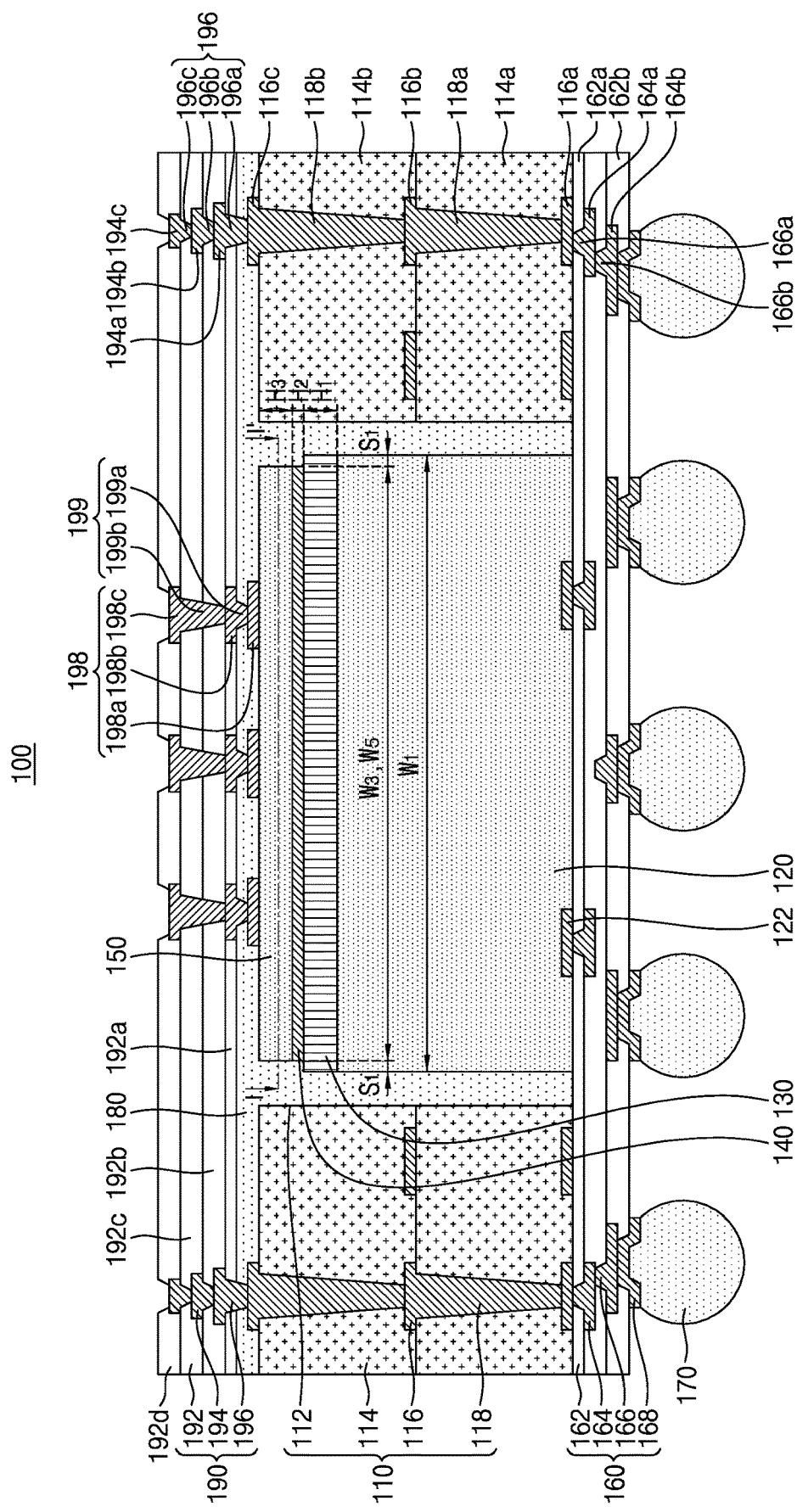
FIG. 1A is a vertical cross-sectional view of a semiconductor package according to an embodiment of the disclosure.
Figure 1B:
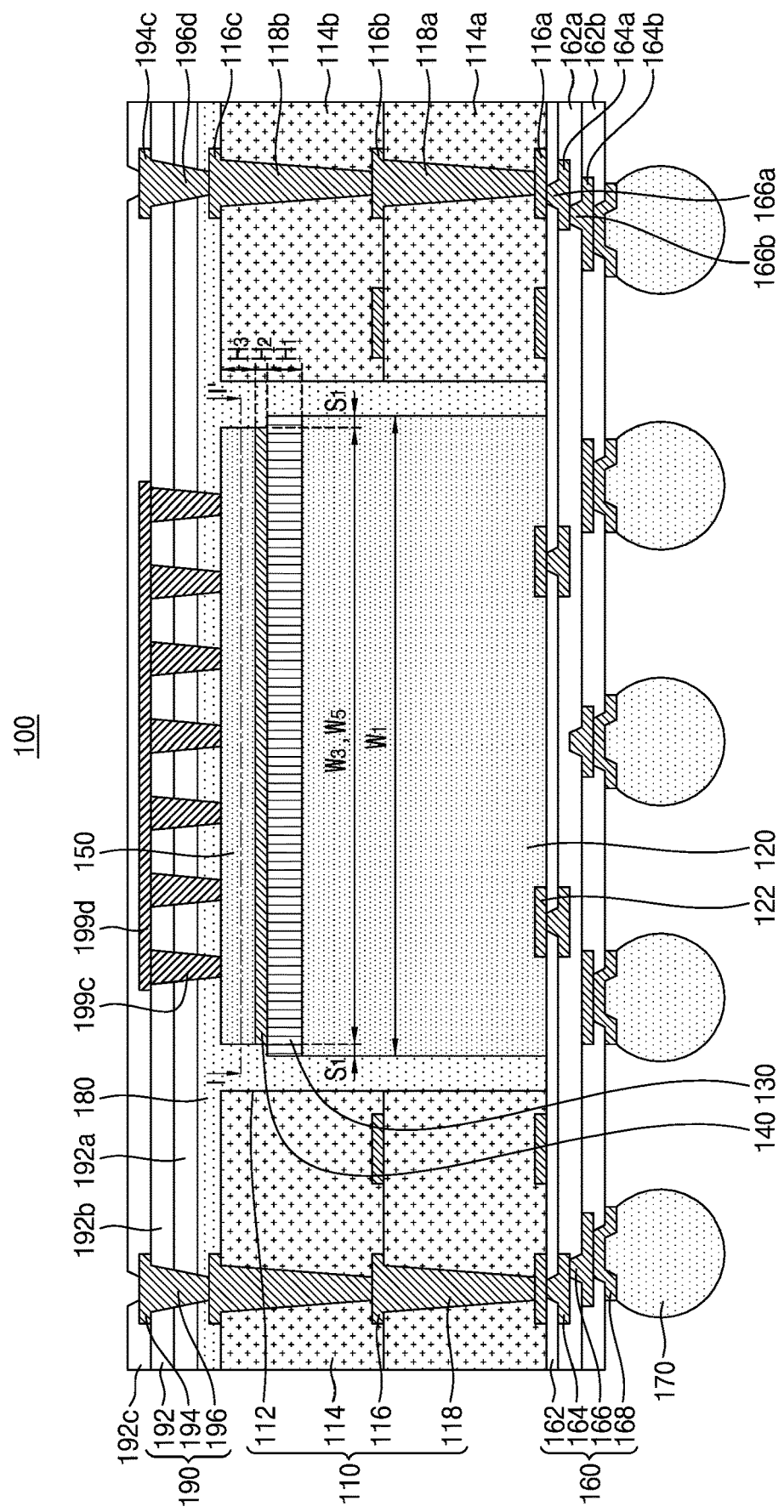
FIG. 1B is a vertical cross-sectional view of a semiconductor package according to an embodiment of the disclosure.
Figure 2:
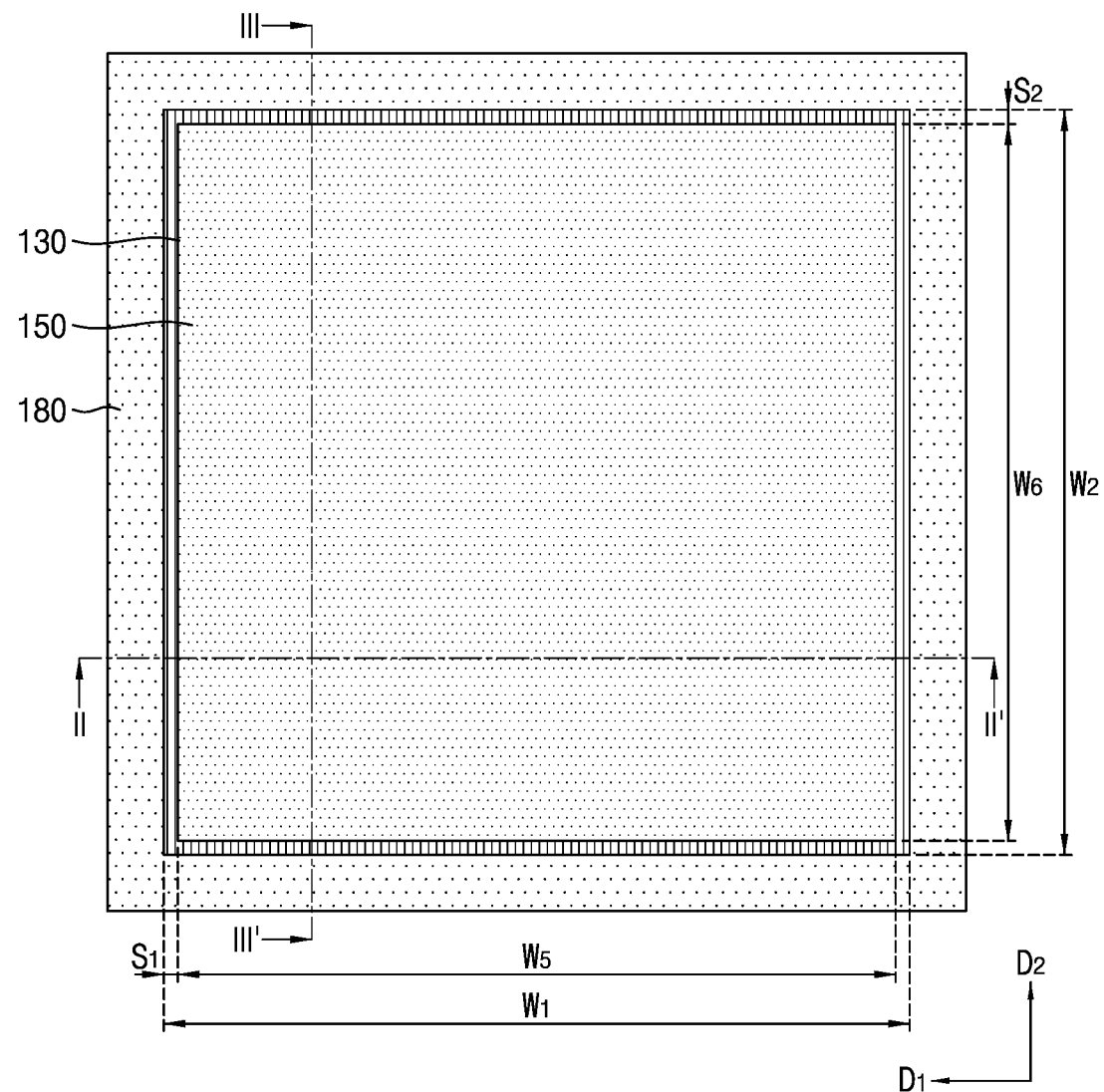
FIG. 2 is a horizontal cross-sectional view taken along line I-I' of the semiconductor package illustrated in FIG. 1.
Figure 3A:
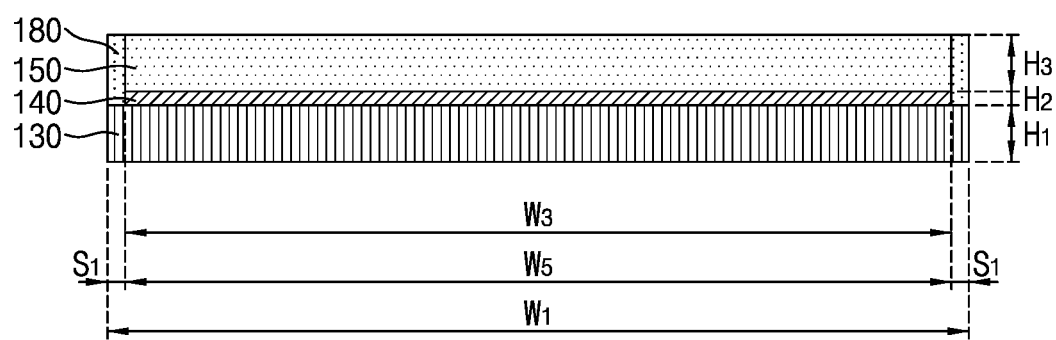
FIG. 3A is a vertical cross-sectional view taken along line II-II' of the semiconductor package illustrated in FIG. 2.
Figure 3B:
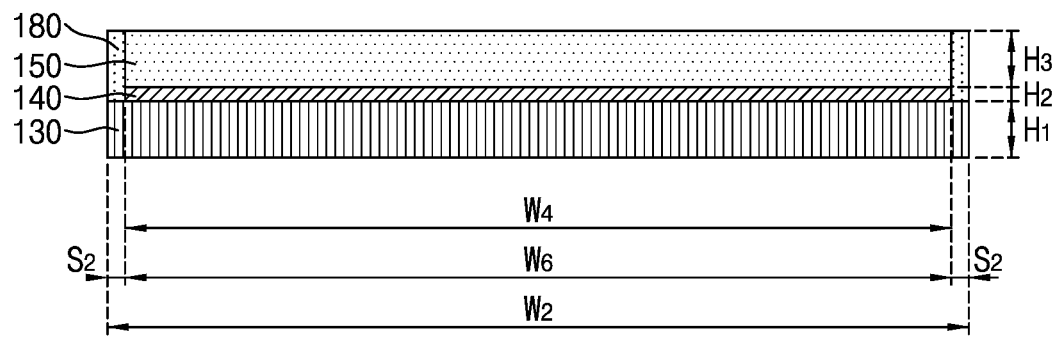
FIG. 3B is a vertical cross-sectional view taken along line III-III' of the semiconductor package illustrated in FIG. 2.

FIG. 1A is a vertical cross-sectional view of a semiconductor package according to an embodiment of the disclosure. FIG. 1B is a vertical cross-sectional view of a semiconductor package according to an embodiment of the disclosure. FIG. 2 is a horizontal cross-sectional view taken along line I-I' of the semiconductor package illustrated in FIG. 1. FIG. 3A is a vertical cross-sectional view taken along line II-IF of the semiconductor package illustrated in FIG. 2. FIG. 3B is a vertical cross-sectional view taken along line of the semiconductor package illustrated in FIG. 2.

Referring to FIGS. 1A to 3B, a semiconductor package 100 according to an embodiment of the disclosure may include a connection layer 110, a semiconductor chip 120, an adhesive layer 130, a thin film layer 140, a heat spreader layer 150, a lower redistribution layer 160, an external connection terminal 170, an encapsulant 180, and an upper redistribution layer 190.

The connection layer 110 may be a plate having a tetragonal rim shape in a top view. The connection layer 110 may include a cavity 112, a core 114, conductive pads 116, and conductive vias 118. The cavity 112 may be formed at a center portion of the connection layer 110. The core 114 may include a first core 114a including a bottom surface contacting the lower redistribution layer 160, and a second core 114b disposed on the first core 114a. The conductive pads 116 may include a first conductive pad 116a buried into the first core 114a, a second conductive pad 116b disposed on the first core 114a, and a third conductive pad 116c disposed on the second core 114b. For example, a bottom surface of the first conductive pad 116a and the bottom surface of the first core 114a may be coplanar and the first conductive pad 116a may protrude into the first core 114a, a bottom surface of the second conductive pad 116b and a top surface of the first core 114a may be coplanar and the second conductive pad 116b may protrude from the top surface of the first core 114a, and a bottom surface of the third conductive pad 116c and a top surface of the second core 114b may be coplanar and the third conductive pad 116c may protrude from the top surface of the second core 114b. The conductive vias 118 may include a first conductive via 118a which passes through the first core 114a and electrically connects the first conductive pad 116a to the second conductive pad 116b, and a second conductive via 118b which passes through the second core 114b and electrically connects the second conductive pad 116b to the third conductive pad 116c.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Spatially relative terms, such as "top," "bottom," "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

For example, the core 114 may include an insulating material. The insulating material may be a thermo curable resin such as an epoxy resin, a thermoplastic resin such as polyimide, or an insulating material (for example, prepreg, Ajinomoto build-up film (ABF), FR-4, and bismaleimide triazine (BT)) where each of the resins is impregnated into a core material such as an inorganic filler and/or a glass fiber (for example, glass cloth or glass fabric).

For example, the conductive pads 116 may include at least one of electrolytically deposited (ED) copper foil, rolled-annealed (RA) copper foil, stainless steel foil, aluminum foil, ultra-thin copper foils, sputtered copper, and copper alloys. For example, the conductive via 118 may include at least one of copper (Cu), nickel (Ni), stainless steel, and beryllium copper.

The semiconductor chip 120 may be disposed in the cavity 112. For example, the semiconductor chip 120 may be disposed to be surrounded by the connection layer 110 such that outer side surfaces of the semiconductor chip face inner side surfaces of the connection layer 110. The semiconductor chip 120 may be described as being disposed at a center portion of the connection layer 110, for example, such that taking the entire connection layer outer boundary as a whole, the semiconductor chip 120 is disposed at a center portion within that boundary. A horizontal width of the semiconductor chip 120 may be less than a horizontal width of the cavity 112. The semiconductor chip 120 may be disposed to be spaced apart from an inner surface of the connection layer 110. A chip pad 122 may be disposed under the semiconductor chip 120. A bottom surface of the chip pad 122 may be coplanar with a bottom surface of the semiconductor chip 120. For example, the chip pad 122 may be embedded in the semiconductor chip 120. The bottom surface of the chip pad 122 may be coplanar with a bottom surface of the first conductive pad 116a. In an embodiment, the chip pad 122 may have a structure which is disposed on the bottom surface of the semiconductor chip 120 to protrude from the bottom surface of the semiconductor chip 120.

The semiconductor chip 120 may include and/or may be an application processor (AP) chip such as a microprocessor or a microcontroller, a logic chip such as a central processing unit (CPU), a graphics processing unit (GPU), modem, an application-specific integrated circuit (ASIC), or a field programmable gate array (FPGA), a volatile memory such as dynamic random access memory (DRAM) or static random access memory (SRAM), and a non-volatile memory such as phase-change random access memory (PRAM), magnetoresistive random access memory (MRAM), ferroelectric random access memory (FeRAM), or resistive random access memory (RRAM). In each embodiments of the disclosure, one semiconductor chip 120 is illustrated, but this is merely an example and plural semiconductor chips may be included in a package, and the semiconductor chip 120 may include and/or may be any one or more of semiconductor chips of all types which are to be packaged, like 2.1-dimensional (2.1D) semiconductor chips, 2.5-dimensional (2.5D) semiconductor chips, and three-dimensional (3D) semiconductor chips.

The adhesive layer 130 may be disposed on the semiconductor chip 120. The adhesive layer 130 may completely cover a top surface of the semiconductor chip 120. For example, a width $W_1$ of the adhesive layer 130 in a first horizontal direction $D_1$ may be the same as a width of the semiconductor chip 120 in the first horizontal direction $D_1$, and a width $W_2$ of the adhesive layer 130 in a second horizontal direction $D_2$ may be the same as a width of the semiconductor chip 120 in the second horizontal direction D2. A thickness H1 of the adhesive layer 130 may be about 2 μm to about 8 μm. The adhesive layer 130 may include a material which is relatively higher in thermal conductivity than an organic compound. For example, the adhesive layer 130 may include at least one of silicon oxide ($SiO_x$), epoxy, polyimide (PI), and polymex. When the adhesive layer 130 includes at least one of silicon oxide, epoxy, polyimide, and polymex, a heat dissipation effect may be higher than when the adhesive layer 130 includes an organic compound having relatively low thermal conductivity. The adhesive layer 130 may be provided between the semiconductor chip 120 and the thin film layer 140, and thus, an adhesive force between the semiconductor chip 120 and the thin film layer 140 may be improved.

Terms such as "about" or "approximately" may reflect amounts, sizes, orientations, or layouts that vary only in a small relative manner, and/or in a way that does not significantly alter the operation, functionality, or structure of certain elements. Distances described as the same as other distances, half of other distances, etc., may be exactly the same or half, or may be substantially the same, half, etc., within acceptable variations caused by manufacturing, etc. For example, a range from "about 0.1 to about 1" may encompass a range such as a 0%-5% deviation around 0.1 and a 0% to 5% deviation around 1, especially if such deviation maintains the same effect as the listed range.

The thin film layer 140 may be disposed on the adhesive layer 130. A width $W_3$ of the thin film layer 140 in the first horizontal direction $D_1$ may be less than the width $W_1$ of the adhesive layer 130 by two times a first length $S_1$ in the first horizontal direction $D_1$. For example, the first length $S_1$ may be about 1 μm to about 4 μm. A width $W_4$ of the thin film layer 140 in the second horizontal direction $D_2$ may be less than the width $W_2$ of the adhesive layer 130 by two times a second length $S_2$ in the second horizontal direction $D_2$. For example, the second length $S_2$ may be about 1 μm to about 4 μm. In an embodiment, the first length $S_1$ may be the same as the second length $S_2$. For example, the first horizontal direction $D_1$ may be perpendicular to the second horizontal direction $D_2$.

A thickness $H_2$ of the thin film layer 140 may be about 0.04 μm to about 0.16 μm. The thin film layer 140 may include or be formed of a material which is less in coefficient of thermal expansion (CTE) than the heat spreader layer 150. For example, the thin film layer 140 may include or be formed of at least one of tungsten (W), titanium (Ti), tantalum (Ta), silicon oxide ($SiO_x$), tantalum oxide (TaO), silicon nitride (SiN), and tantalum nitride (TaN).

The heat spreader layer 150 may be disposed on the thin film layer 140. A width $W_5$ of the heat spreader layer 150 in the first horizontal direction $D_1$ may be the same as a $width_3$ of the thin film layer 140 in the first horizontal direction $D_1$, and a width $W_6$ of the heat spreader layer 150 in the second horizontal direction $D_2$ may be the same as a width $W_4$ of the thin film layer 140 in the second horizontal direction $D_2$. A thickness $H_3$ of the heat spreader layer 150 may be about 2 μm to about 8 μm. In an embodiment, the thickness $H_3$ of the heat spreader layer 150 may be the same as the thickness $H_1$ of the adhesive layer 130. The heat spreader layer 150 may include or be formed of a material which is high in thermal conductivity. For example, the heat spreader layer 150 may include or be formed of at least one of Cu, a Cu alloy, diamond (C), carbon nano tube (CNT), and boron nitride (BN). The thin film layer 140 may include or be formed of a material which is lower in CTE than the heat spreader layer 150, and thus, may prevent the heat spreader layer 150 from thermally expanding and penetrating into the semiconductor chip 120 or the adhesive layer 130.

The lower redistribution layer 160 may be disposed on a bottom surface of the connection layer 110. The lower redistribution layer 160 may include an insulation layer 162 and a wiring pattern. The wiring pattern may include a redistribution pattern 164, a conductive via 166, and an under bump metallurgy (UBM) 168. For example, the UBM 168 may be a metal pattern which the external connection terminal 170 may contact. The insulation layer 162 may include a plurality of first insulation layers 162a, each including a top surface contacting the connecting layer 110, and a second insulation layer 162b which is disposed on a bottom surface of the first insulation layer 162a and includes a bottom surface exposed. For example, the plurality of first insulation layers 162a may be laterally arranged. For example, the plurality of the first insulation layers 162a may be positioned at the same vertical level.

The redistribution pattern 164 may include a first redistribution pattern 164a buried into the first insulation layer 162b and a second redistribution pattern 164b disposed on the bottom surface of the first insulation layer 162b. Conductive vias 166 may include a first conductive via 166a, which passes through the first insulation layer 162a and electrically connects the first conductive pad 116a to the first redistribution pattern 164a, and a second conductive via 166b which passes through the second insulation layer 162b and electrically connects the first redistribution pattern 164a to the second redistribution pattern 164b. The UBM 168 may be disposed on a bottom surface of the second redistribution pattern 164b. For example, the insulation layer 162 may include or be formed of ABF, epoxy, or polyimide. The insulation layer 162 may include or be formed of a photosensitive polymer. For example, the photosensitive polymer may include at least one of photosensitive polyimide, polybenzoxazole, a phenolic polymer, and a benzocyclobutene-based polymer. The redistribution pattern 164 and the UBM 168 may include or be formed of Cu, Ni, stainless steel, or a Cu alloy such as beryllium copper.

The external connection terminal 170 may be disposed on a bottom surface of the UBM 168. The external connection terminal 170 may be electrically connected to the lower redistribution layer 160. The external connection terminal 170 may be electrically connected to the semiconductor chip 120 and/or the conductive via 118 through the wiring pattern of the lower redistribution layer 160. The external connection terminal 170 may be a solder ball or a solder bump.

The encapsulant 180 may be disposed on the lower redistribution layer 160. The encapsulant 180 may be filled into a space between the connection layer 110 and the semiconductor chip 120, the adhesive layer 130, the thin film layer 140, and the heat spreader layer 150. For example, the encapsulant 180 may include or be formed of an insulating material such as ABF.

The upper redistribution layer 190 may be disposed on a top surface of the encapsulant 180. A sidewall of the upper redistribution layer 190 may be disposed to be vertically aligned with a portion of an outer sidewall of the encapsulant 180. The upper redistribution layer 190 may be electrically connected to the lower redistribution layer 160 through the conductive vias 118.

The upper redistribution layer 190 may include an insulation layer 192, a redistribution pattern 194, and a conductive via 196. The insulation layer 192 may include a first insulation layer 192a including a bottom surface contacting the encapsulant 180, a second insulation layer 192b disposed on a top surface of the first insulation layer 192a, and a third insulation layer 192c disposed on a top surface of the second insulation layer 192b. The third insulation layer 192c may be a passivation layer. As illustrated in FIG. 1A, the redistribution pattern 194 may include a first redistribution pattern 194a buried into both/opposite portions of the second insulation layer 192b, a second redistribution pattern 194b disposed at both/opposite sides of the top surface of the second insulation layer 192b, and a third redistribution pattern 194c disposed at both/opposite sides of the top surface of the third insulation layer 192c. As illustrated in FIG. 1B, the redistribution pattern 194 may include only the third redistribution pattern 194c. For example, the redistribution pattern 194 may be formed of a single layer of redistribution pattern.

As illustrated in FIG. 1A, conductive vias 196 may include a first conductive via 196a which passes through the encapsulant 180 and the first insulation layer 192a and electrically connects the third conductive pad 116c to the first redistribution pattern 194a, a second conductive via 196b which passes through the second insulation layer 192b and electrically connects the first redistribution pattern 194a to the second redistribution pattern 194b, and a third conductive via 196c which passes through the third insulation layer 192c and electrically connects the second redistribution pattern 194b to the third redistribution pattern 194c. As illustrated in FIG. 1B, the conductive via 196 may include only a fourth conductive via 196d which passes through the encapsulant 180, the first insulation layer 192a, and the second insulation layer 192b and electrically connects the third conductive pad 116c to the third redistribution pattern 194c.

As illustrated in FIG. 1A, a heat dissipation pad 198 and a heat dissipation via 199 may be disposed at a center portion of the encapsulant 180 and a center portion of the upper redistribution layer 190. The heat dissipation pad 198 and the heat dissipation via 199 may be covered by a fourth insulation layer 192d. The heat dissipation via 199 may vertically overlap the semiconductor chip 120, the adhesive layer 130, the thin film layer 140, and the heat spreader layer 150. Heat dissipation pads 198 may include a first heat dissipation pad 198a disposed at a center portion of an inner sidewall of the encapsulant 180, a second heat dissipation pad 198b buried into a center portion of the first insulation layer 192a, and a third heat dissipation pad 198c disposed on a top surface of the third insulation layer 192c. Heat dissipation vias 199 may include a first heat dissipation via 199a which passes through the encapsulant 180 and connects the first heat dissipation pad 198a to the second heat dissipation pad 198b, and a second heat dissipation via 199b which passes through the first insulation layer 192a, the second insulation layer 192b and the third insulation layer 192c and electrically connects the second heat dissipation pad 198b to the third heat dissipation pad 198c.

As illustrated in FIG. 1B, the heat dissipation via 199 may include a third heat dissipation via 199c which passes through the encapsulant 180, the first insulation layer 192a, and the second insulation layer 192b. When the heat dissipation via 199 includes only the third heat dissipation via 199c, a heat dissipation layer 199d may be disposed on the top surface of the second insulation layer 192b, and a plurality of third heat dissipation vias 199c may be thermally connected to one another by the heat dissipation layer 199d. The heat dissipation via 199 may be formed by a $CO_2$ laser process. For example, the heat dissipation pad 198 and the heat dissipation via 199 may include at least one of Cu, a Cu alloy, diamond (C), CNT, and BN. Heat generated/occurring in the semiconductor chip 120 may transfer/flow to the heat spreader layer 150 through the adhesive layer 130 and the thin film layer 140 and may be dissipated to the outside through the heat dissipation pad 198 and the heat dissipation vias 199.

Figure 4:
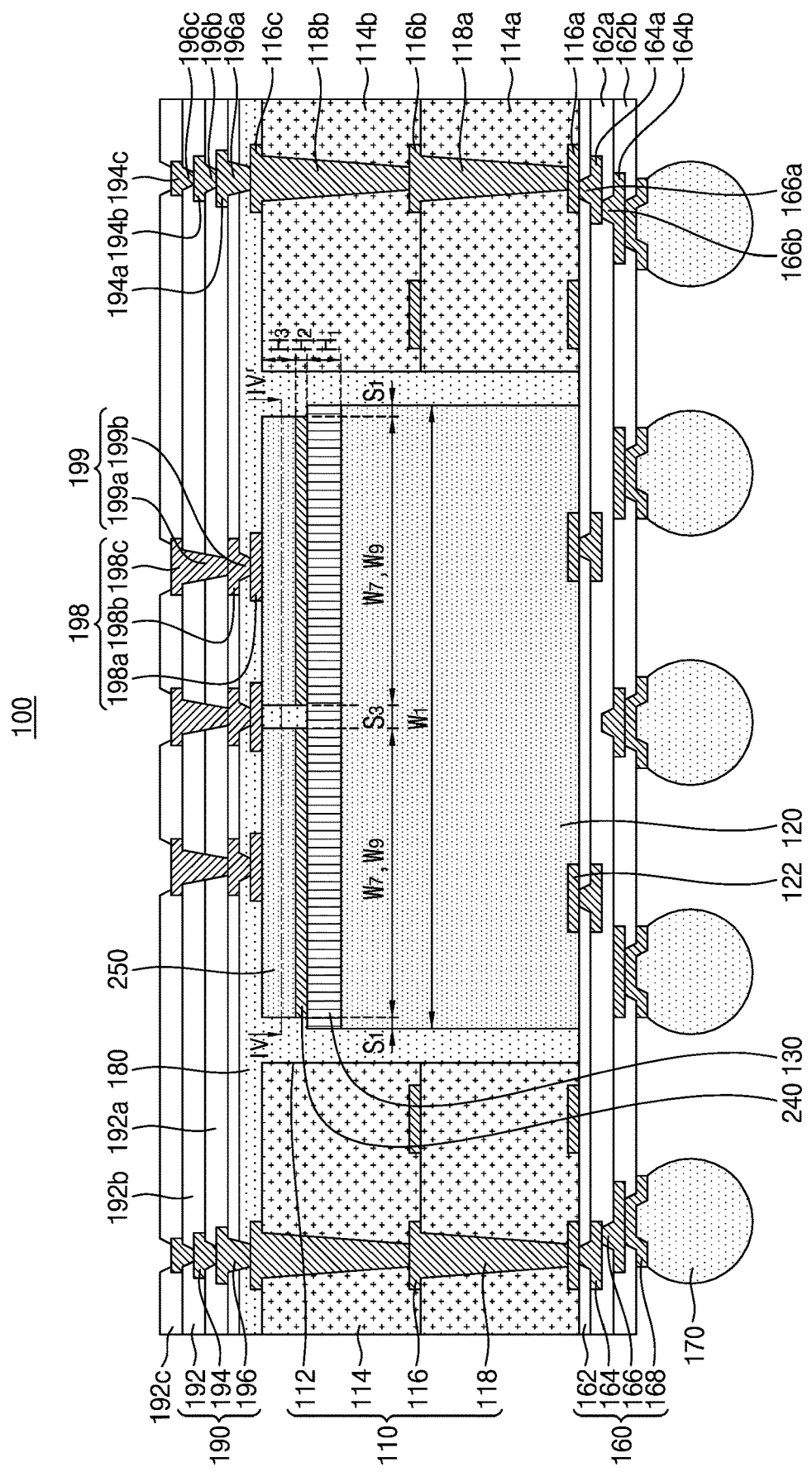
FIG. 4 is a vertical cross-sectional view of a semiconductor package according to an embodiment of the disclosure.
Figure 5:
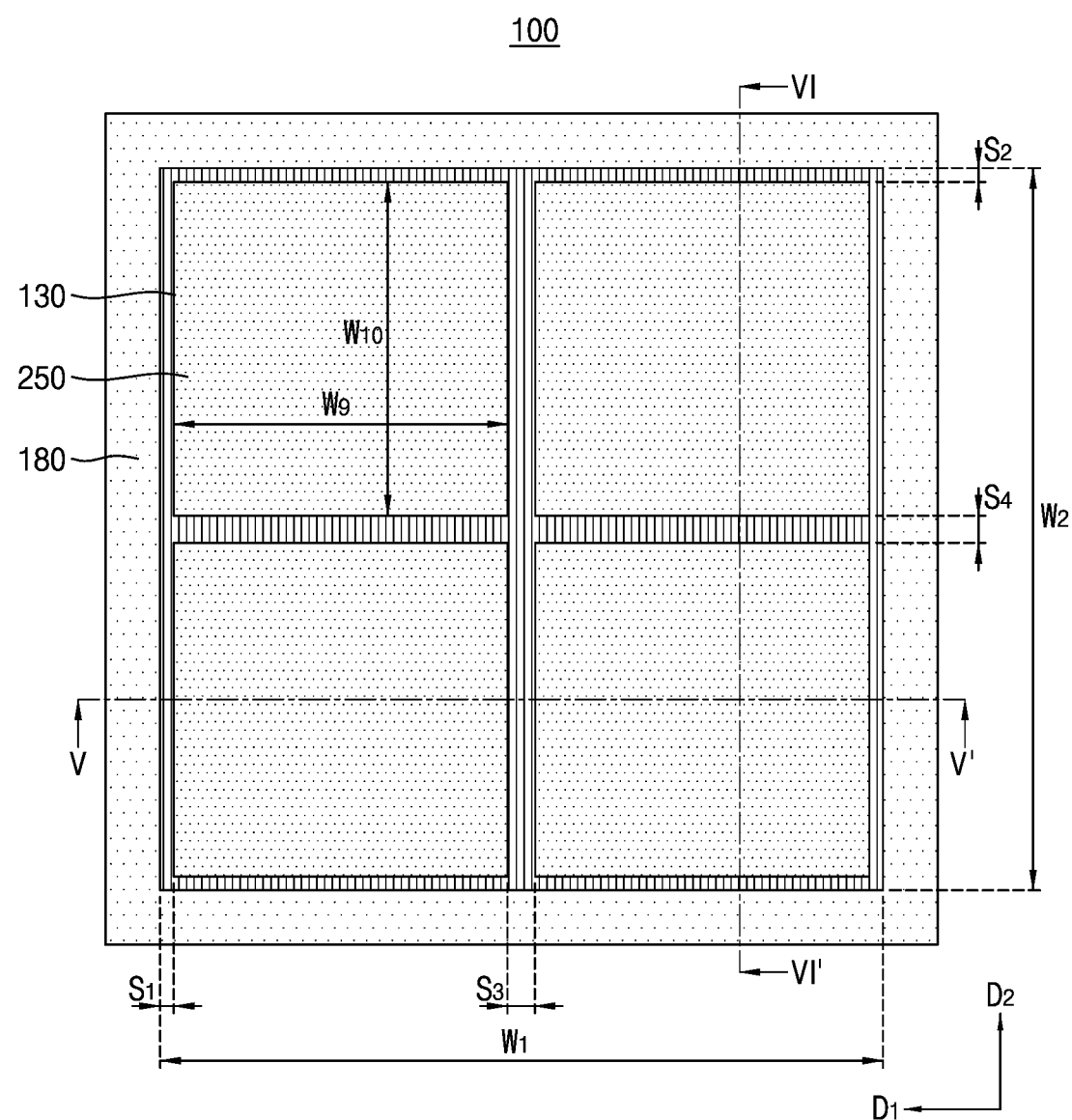
FIG. 5 is a horizontal cross-sectional view taken along line IV-IV' of the semiconductor package illustrated in FIG. 4.
Figure 6A:
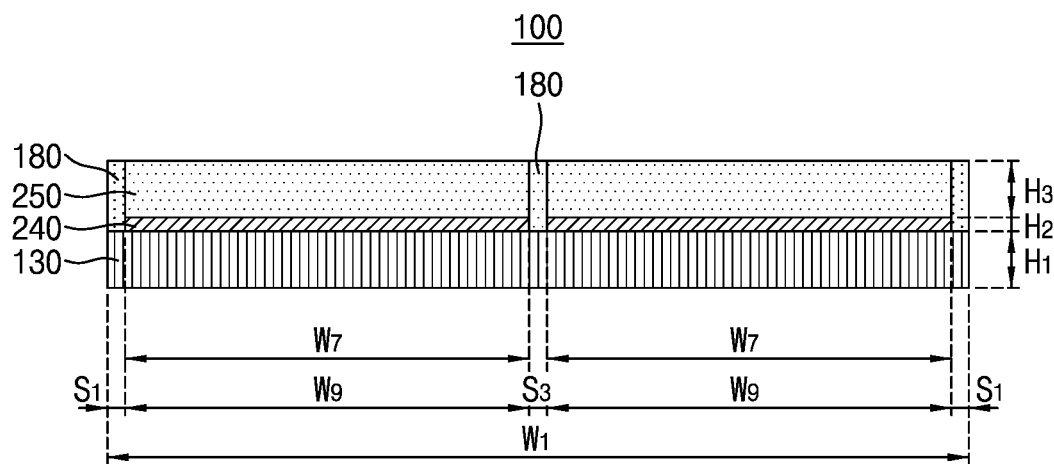
FIG. 6A is a vertical cross-sectional view taken along line V-V' of the semiconductor package illustrated in FIG. 5.
Figure 6B:
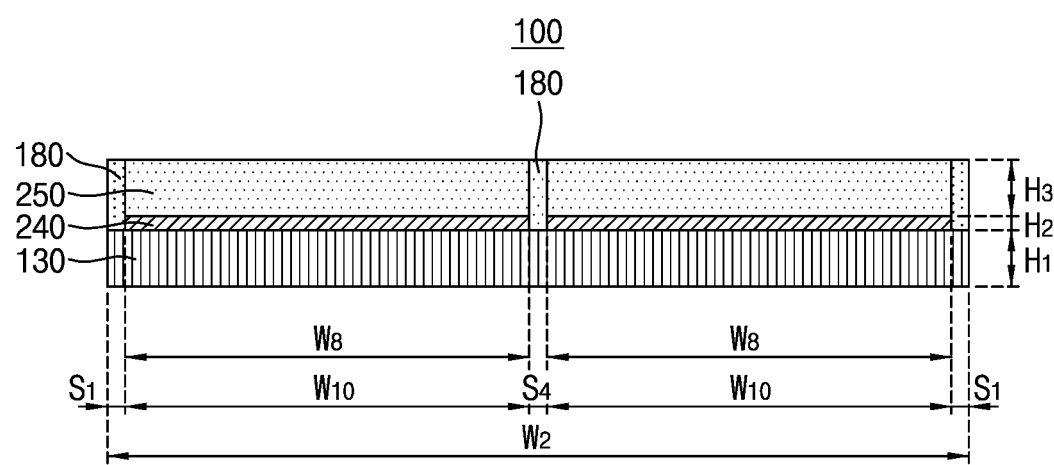
FIG. 6B is a vertical cross-sectional view taken along line VI-VI' of the semiconductor package illustrated in FIG. 5.

FIG. 4 is a vertical cross-sectional view of a semiconductor package according to an embodiment of the disclosure. FIG. 5 is a horizontal cross-sectional view taken along line IV-IV' of the semiconductor package illustrated in FIG. 4. FIG. 6A is a vertical cross-sectional view taken along line V-V' of the semiconductor package illustrated in FIG. 5. FIG. 6B is a vertical cross-sectional view taken along line VI-VI' of the semiconductor package illustrated in FIG. 5.

Referring to FIGS. 4 to 6B, a semiconductor package 100 according to an embodiment of the disclosure may include a connection layer 110, a semiconductor chip 120, an adhesive layer 130, a plurality of thin film layers 240, a plurality of heat spreader layers 250, a lower redistribution layer 160, an external connection terminal 170, an encapsulant 180, and an upper redistribution layer 190.

The adhesive layer 130 may be disposed on the semiconductor chip 120. The plurality of thin film layers 240 may be disposed on the adhesive layer 130. The plurality of thin film layers 240 may be disposed in a lattice pattern. For example, two thin film layers 240 may be disposed laterally in a first horizontal direction $D_1$. Each of the plurality of thin film layers 240 may be apart from, by a first length $S_1$, a corresponding corner of the adhesive layer 130 in a second horizontal direction $D_2$ and may be apart from, by a second length $S_2$, the corresponding corner of the adhesive layer 130 in the first horizontal direction $D_1$. Adjacent thin film layers 240 may be apart from each other by a third length $S_3$ with respect to the first horizontal direction $D_1$ and may be apart from each other by a fourth length $S_4$ with respect to the second horizontal direction $D_2$. A width $W_7$ of each of the thin film layers 240 in the first horizontal direction $D_1$ and a width $W_8$ of each of the thin film layers 240 in the second horizontal direction $D_2$ may be expressed as the following Equations 1 and 2.

$$W_7 = \frac{W_1}{2} - S_1 - \frac{S_3}{2} \qquad \text{[Equation 1]}$$

$$W_8 = \frac{W_2}{2} - S_2 - \frac{S_4}{2} \qquad \text{[Equation 2]}$$

The first length $S_1$ may be half of the third length $S_3$, and the second length $S_2$ may be half of the fourth length $S_4$. In this case, the width $W_7$ of each of the thin film layers 240 in the first horizontal direction $D_1$ and the width $W_8$ of each of the thin film layers 240 in the second horizontal direction $D_2$ may be expressed as the following Equations 3 and 4.

$$W_7 = \frac{W_1}{2} - 2S_1 \qquad \text{[Equation 3]}$$

$$W_8 = \frac{W_2}{2} - 2S_2 \qquad \text{[Equation 4]}$$

For example, when each of the first length $S_1$ and the second length $S_2$ is about 1 μm to about 4 μm, the width $W_7$ of each of the thin film layers 240 in the first horizontal direction $D_1$ and the width $W_8$ of each of the thin film layers 240 in the second horizontal direction $D_2$ may respectively be 2 μm to 8 μm less than half of the width $W_1$ of the adhesive layer 130 in the first horizontal direction $D_1$ and half of the width $W_2$ of the adhesive layer 130 in the second horizontal direction $D_2$. In an embodiment, when the width $W_1$ of the adhesive layer 130 in the first horizontal direction $D_1$ is the same as the width $W_2$ of the adhesive layer 130 in the second horizontal direction $D_2$ and the first length $S_1$, the second length $S_2$, the third length $S_3$, and the fourth length $S_4$ are the same, the width $W_7$ of each of the thin film layers 240 in the first horizontal direction $D_1$ may be the same as the width $W_8$ of each of the thin film layers 240 in the second horizontal direction $D_2$.

The plurality of heat spreader layers 250 may be respectively disposed on the plurality of thin film layers 240. The plurality of heat spreader layers 250 may be disposed in a lattice pattern. A width $W_9$ of each of the heat spreader layers 250 in the first horizontal direction $D_1$ may be the same as the width $W_7$ of each of the thin film layers 240 in the first horizontal direction $D_1$, and a width $W_{10}$ of each of the heat spreader layers 250 in the second horizontal direction $D_2$ may be the same as the width $W_8$ of each of the thin film layers 240 in the second horizontal direction $D_2$. The widths $W_7$ and $W_8$ of each of the thin film layers 240 and the widths $W_9$ and $W_{10}$ of each of the heat spreader layers 250 may be set to be less than the widths $W_7$ and $W_8$ of the adhesive layer 130, thereby decreasing an effective area of a warpage phenomenon of the semiconductor package 100 caused by a stress of the heat spreader layer 250 having a relatively large CTE in a semiconductor manufacturing process performed at a high temperature.

Figure 7B:
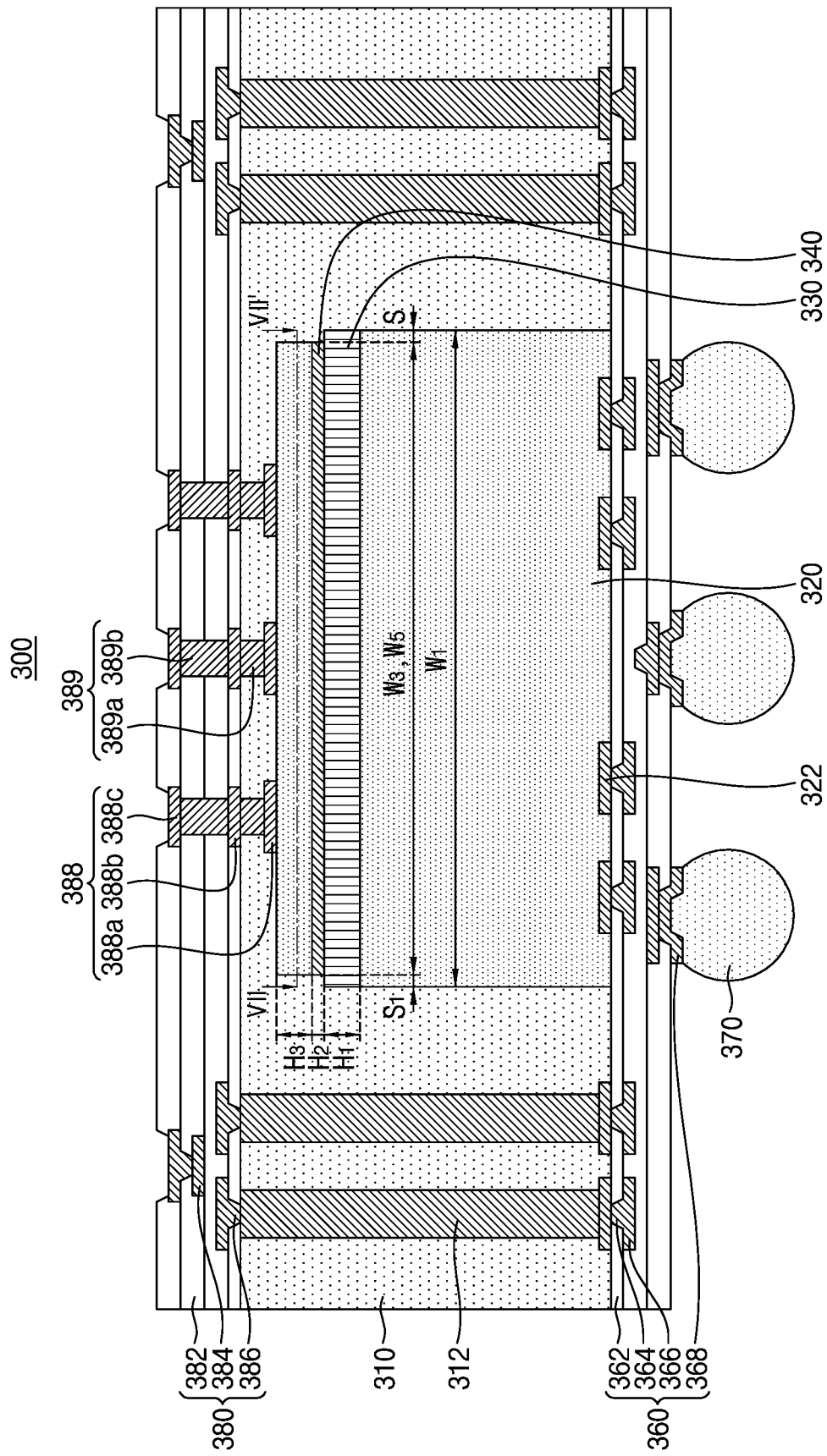
Figure 8:
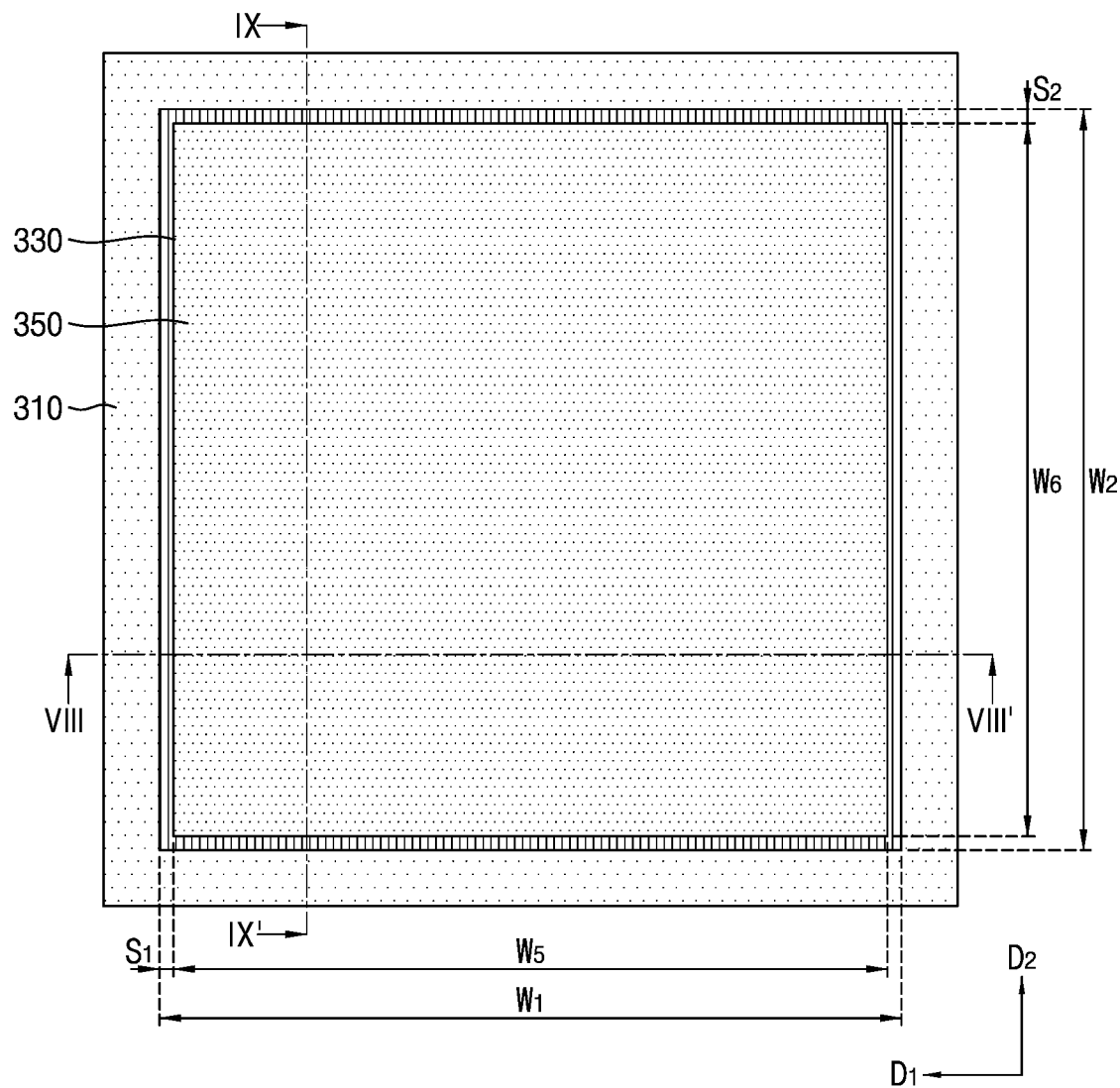
FIG. 8 is a horizontal cross-sectional view taken along line VII-VII' of the semiconductor package illustrated in FIGS. 7A and 7B.

FIGS. 7A and 7B are vertical cross-sectional views of a semiconductor package according to an embodiment of the disclosure. FIG. 8 is a horizontal cross-sectional view taken along line VII-VII' of the semiconductor package illustrated in FIGS. 7A and 7B.

Referring to FIGS. 7A to 8, a semiconductor package 300 according to an embodiment of the disclosure may include an encapsulant 310, a connection layer 312, a semiconductor chip 320, an adhesive layer 330, a thin film layer 340, a heat spreader layer 350, a lower redistribution layer 360, an external connection terminal 370, and an upper redistribution layer 380.

The semiconductor chip 320, the adhesive layer 330, the thin film layer 340, the heat spreader layer 350, the lower redistribution layer 360, and the upper redistribution layer 380 may be respectively the same as the semiconductor chip 120, the adhesive layer 130, the thin film layer 140, the heat spreader layer 150, the lower redistribution layer 160, and the upper redistribution layer 180 illustrated in FIGS. 1 to 3B. A vertical cross-sectional view taken along line VIII-VIII' of FIG. 8 and a vertical cross-sectional view taken along line IX-IX' of FIG. 8 may be respectively the same as FIGS. 3A and 3B.

The encapsulant 310 may have a structure which covers the heat spreader layer 350 and the lower redistribution layer 360. A vertical-direction inner sidewall of the encapsulant 310 may contact a sidewall of the semiconductor chip 320 and a sidewall of the adhesive layer 350. A horizontal inner surface of the encapsulant 310 may contact a top surface of the heat spreader layer 350. For example, the encapsulant 312 may include or be formed of an epoxy molding compound (EMC), a thermoplastic resin such as polyimide, or a resin where a reinforcing agent such as an inorganic filler is added thereto, and for example, may include or be formed of ABF, FR-4, BT, or a resin. Also, the encapsulant 312 may include or be formed of a molding material such as an EMC or a photosensitive material such as PIE. The connection layer 312 may pass through the encapsulant 310 and may be a conductive via which electrically connects the lower redistribution layer 360 to the upper redistribution layer 380.

The external connection terminal 370 may be disposed on a bottom surface of the lower redistribution layer 360. A horizontal-direction width of a portion of the lower redistribution layer 360 on which external connection terminals 370 are disposed may be greater than a horizontal-direction width of the semiconductor chip 320 as illustrated in FIG. 7A or may be less than the horizontal-direction width of the semiconductor chip 320 as illustrated in FIG. 7B. For example, the semiconductor chip 320 may vertically overlap all of the external connection terminals 370 attached on the lower redistribution layer 360 in some embodiments. In certain embodiments, one or more of the external connection terminals 370 attached on the lower redistribution layer 360 do not vertically overlap the semiconductor chip 320.

Figure 9:
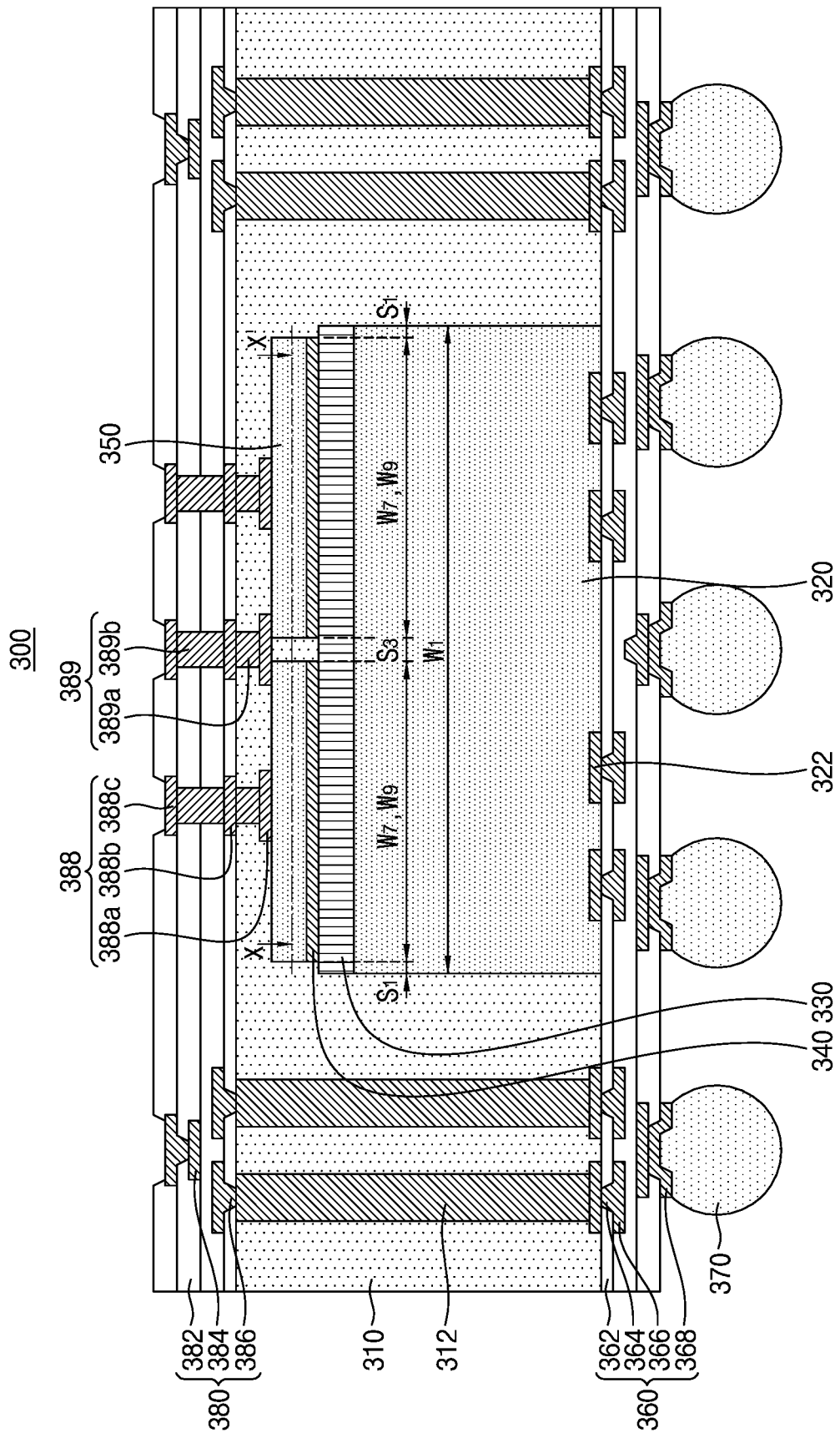
FIG. 9 is a vertical cross-sectional view of a semiconductor package according to an embodiment of the disclosure.
Figure 10:
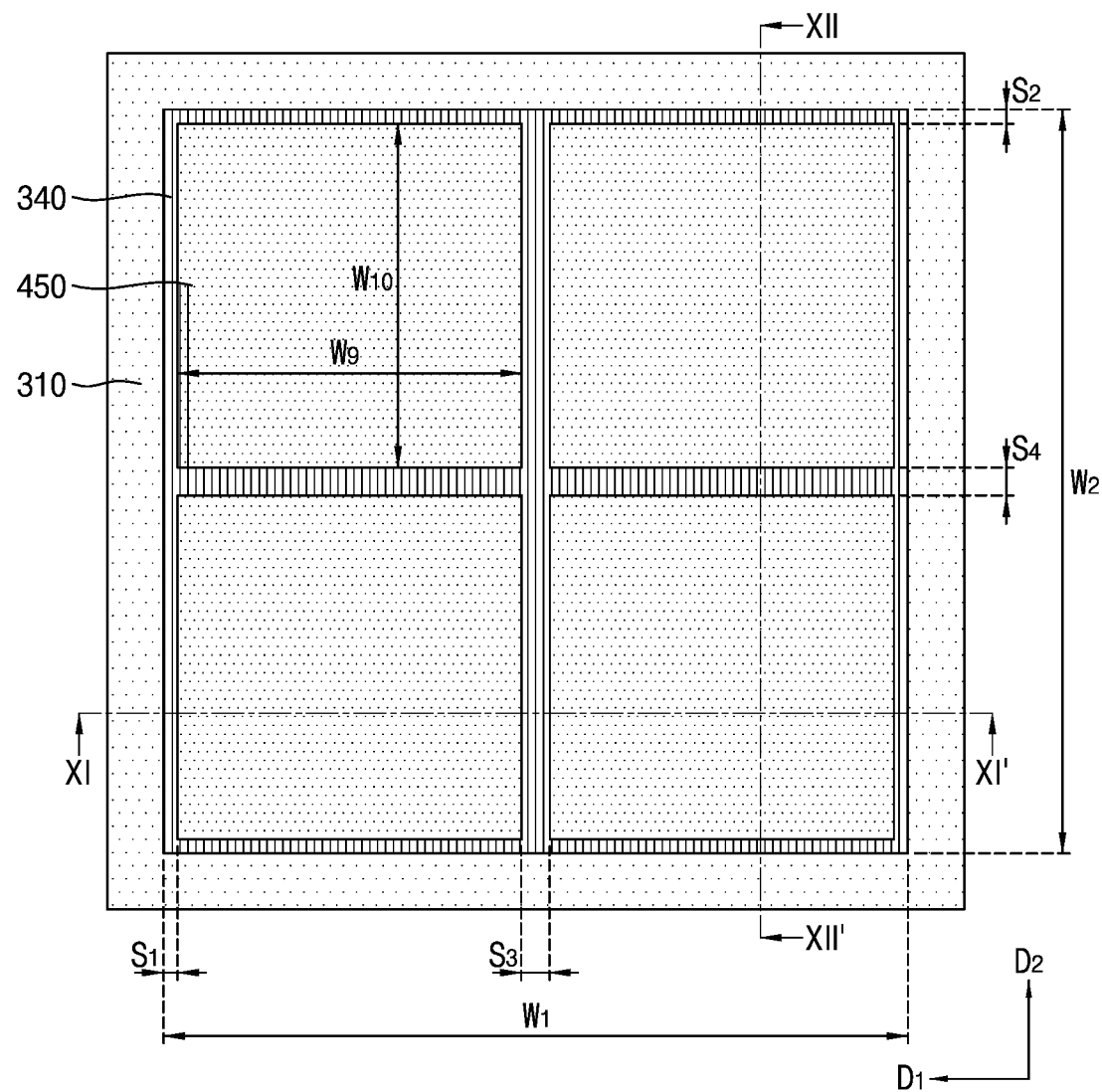
FIG. 10 is a horizontal cross-sectional view taken along line X-X' of the semiconductor package illustrated in FIG. 9.

FIG. 9 is a vertical cross-sectional view of a semiconductor package according to an embodiment of the disclosure. FIG. 10 is a horizontal cross-sectional view taken along line X-X' of the semiconductor package illustrated in FIG. 9.

Referring to FIGS. 9 and 10, a semiconductor package 300 according to an embodiment of the disclosure may include an encapsulant 310, a connection layer 312, a semiconductor chip 320, an adhesive layer 330, a plurality of thin film layers 340, a plurality of heat spreader layers 350, a lower redistribution layer 360, an external connection terminal 370, and an upper redistribution layer 380.

The semiconductor chip 320, the adhesive layer 330, the thin film layers 340, the heat spreader layers 350, the lower redistribution layer 360, and the upper redistribution layer 380 may be respectively the same as the semiconductor chip 120, the adhesive layer 130, the thin film layers 240, the heat spreader layers 250, the lower redistribution layer 160, and the upper redistribution layer 190 illustrated in FIGS. 4 to 6B. A vertical cross-sectional view taken along line XI-XI' of FIG. 10 and a vertical cross-sectional view taken along line XII-XII' of FIG. 10 may be respectively the same as FIGS. 6A and 6B.

Figure 11:
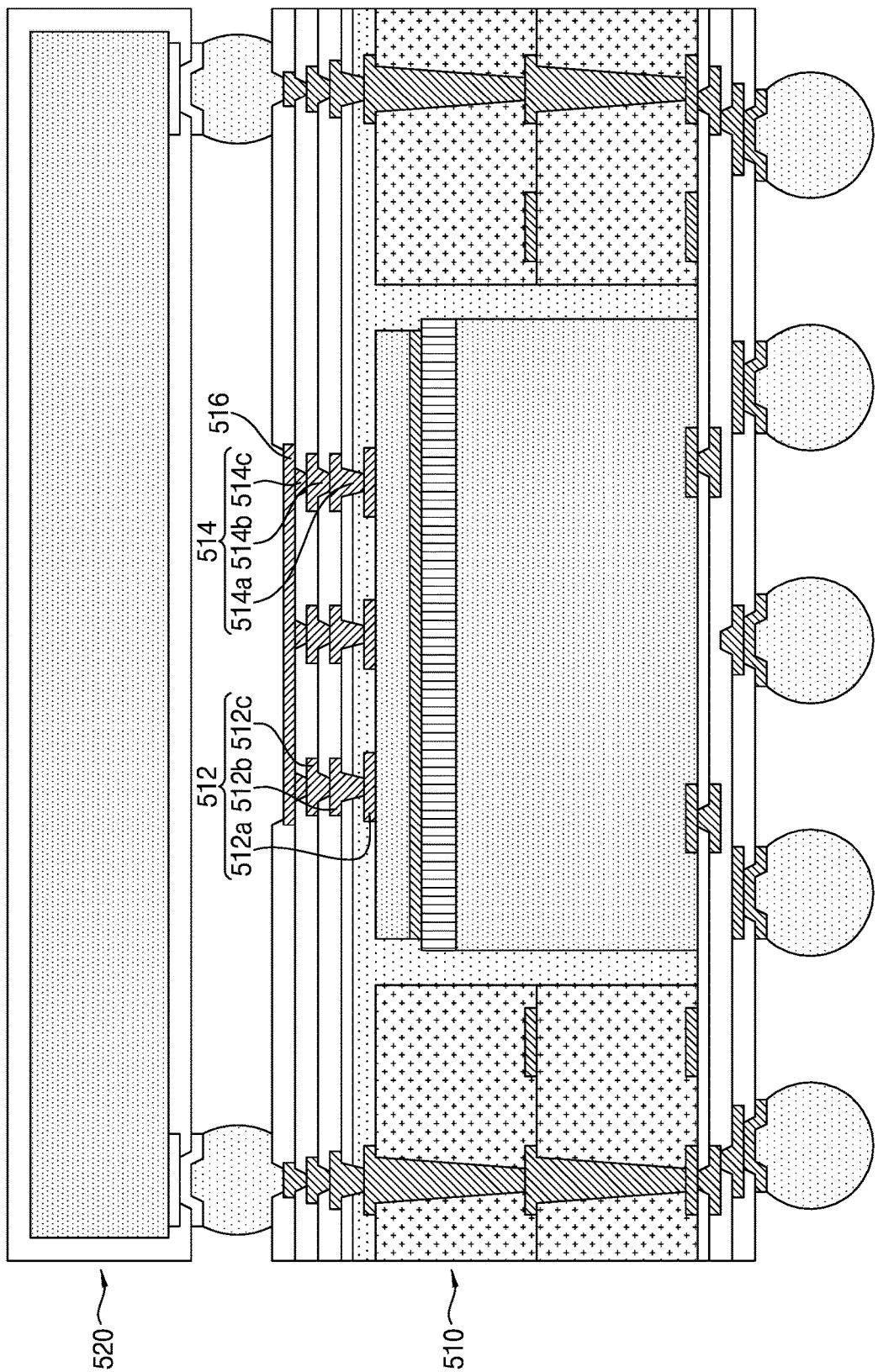
FIG. 11 is a vertical cross-sectional view of a semiconductor package according to an embodiment of the disclosure.

FIG. 11 is a vertical cross-sectional view of a semiconductor package 500 according to an embodiment of the disclosure.

Referring to FIG. 11, the semiconductor package 500 may include a lower semiconductor package 510 and an upper semiconductor package 520. Each of the lower semiconductor package 510 and the upper semiconductor package 520 may be the same as one of the semiconductor packages 100 to 300 illustrated in FIGS. 1 to 10.

The lower semiconductor package 510 and the upper semiconductor package 520 may be electrically connected to each other by an external connection terminal of the upper semiconductor package 520.

FIG. 12 is a vertical cross-sectional view of a semiconductor package 600 according to an embodiment of the disclosure.

Referring to FIG. 12, the semiconductor package 600 may include a lower semiconductor package 610, an upper semiconductor package 620, and a wire 630. Each of the lower semiconductor package 610 and the upper semiconductor package 620 may be the same as one of the semiconductor packages 100 to 300 illustrated in FIGS. 1 to 10. The upper semiconductor package 620 may be disposed on the lower semiconductor package 610. The lower semiconductor package 610 and the upper semiconductor package 620 may be electrically connected to each other by the wire 630.

According to the embodiments of the disclosure, a width of a heat spreader layer may be set to be less than that of a semiconductor package, and thus, a heat spreader layer may be prevented from being diffused to a semiconductor chip in a semiconductor manufacturing process performed at a high temperature.

According to the embodiments of the disclosure, only an adhesive layer and a thin film layer may be provided between the semiconductor chip and the heat spreader layer, thereby decreasing the manufacturing cost. For example, the adhesive layer and the thin film layer may replace all other layers, patterns and/or materials previously used.

According to the embodiments of the disclosure, the adhesive layer including silicon oxide and/or the like may be provided between the semiconductor chip and the heat spreader layer, and thus, heat occurring/generated in the semiconductor package may be more effectively dissipated than a case where an adhesive layer including an organic material is provided.

Hereinabove, the embodiments of the disclosure have been described with reference to the accompanying drawings, but it may be understood that those skilled in the art may implement the embodiments in another detailed form without changing the inventive concept or the essential feature. It should be understood that the embodiments described above are merely examples in all aspects and are not limited.

What is claimed is:

1. A semiconductor package comprising:
   a connection layer;
   a semiconductor chip disposed at a center portion of the connection layer;
   an adhesive layer disposed on the semiconductor chip;
   a heat spreader layer disposed on the adhesive layer; and
   a lower redistribution layer disposed on the connection layer and a bottom surface of the semiconductor chip,
   wherein a width of the adhesive layer is the same as a width of the semiconductor chip, and a width of the heat spreader layer is less than the width of the adhesive layer, and
   wherein the connection layer includes an insulation layer having through vias formed therethrough, and wherein side surfaces of the semiconductor chip face inner side surfaces of the connection layer and an encapsulant is interposed between the semiconductor chip and the connection layer.

2. The semiconductor package of claim 1, further comprising an encapsulant filled into a space between the connection layer and the semiconductor chip, and between the connection layer and the heat spreader layer.

3. The semiconductor package of claim 1, wherein a thickness of the adhesive layer is about 2 μm to about 8 μm.

4. The semiconductor package of claim 1, wherein the adhesive layer comprises at least one of silicon oxide ($SiO_x$), epoxy, polyimide (PI), and polymex.

5. The semiconductor package of claim 1, further comprising a thin film layer disposed between the adhesive layer and the heat spreader layer.

6. The semiconductor package of claim 5, wherein a width of the thin film layer is 2 μm to 8 μm less than a width of the adhesive layer.

7. The semiconductor package of claim 5, wherein a thickness of the thin film layer is about 0.04 μm to about 0.16 μm.

8. The semiconductor package of claim 5, wherein the thin film layer comprises at least one of tungsten (W), titanium (Ti), tantalum (Ta), silicon oxide (SiOx), tantalum oxide (TaO), silicon nitride (SiN), and tantalum nitride (TaN).

9. The semiconductor package of claim 1, wherein a width of the heat spreader layer is 2 μm to 8 μm less than a width of the adhesive layer.

10. The semiconductor package of claim 1, wherein a thickness of the heat spreader layer is about 2 μm to about 8 μm.

11. The semiconductor package of claim 1, wherein the heat spreader layer comprises at least one of copper (Cu), Cu alloy, diamond (C), carbon nano tube (CNT), and boron nitride (BN).

12. A semiconductor package comprising:
    a connection layer;
    a semiconductor chip laterally surrounded by the connection layer at a first vertical level;
    an adhesive layer disposed on the semiconductor chip;
    a plurality of heat spreader layers formed at a second vertical level different from the first vertical level, and disposed on the adhesive layer to be laterally spaced apart from each other and arranged in a lattice pattern;
    a lower redistribution layer disposed on the connection layer and a bottom surface of the semiconductor chip; and
    an encapsulant formed between the connection layer and the semiconductor chip, and formed between adjacent heat spreader layers of the plurality of heat spreader layers.

13. The semiconductor package of claim 12, wherein each of the plurality of heat spreader layers is apart from a corner of the adhesive layer by a first length, and the plurality of heat spreader layers are apart from one another by a second length in a horizontal direction.

14. The semiconductor package of claim 13, wherein the first length is about 1 μm to about 4 μm.

15. The semiconductor package of claim 13, wherein the first length is half of the second length.

16. The semiconductor package of claim 15, wherein a width of each of the plurality of heat spreader layers is less than half of a width of the adhesive layer by two times the first length.

17. The semiconductor package of claim 12, further comprising a plurality of thin film layers disposed between the adhesive layer and the plurality of heat spreader layers,
    wherein a width of each of the plurality of thin film layers is the same as a width of a corresponding one of the plurality of heat spreader layers.

18. A semiconductor package comprising:
    a semiconductor chip;
    an adhesive layer disposed on the semiconductor chip;
    a thin film layer disposed on the adhesive layer;
    a heat spreader layer disposed on the thin film layer;
    an encapsulant covering the semiconductor chip, the adhesive layer, and the heat spreader layer;

a lower redistribution layer disposed on a bottom surface of the semiconductor chip and a bottom surface of the encapsulant, the lower redistribution layer including an insulation layer and a wiring pattern;

an upper redistribution layer disposed on the encapsulant;

a conductive via connecting the lower redistribution layer to the upper redistribution layer;

an external connection terminal disposed on a bottom surface of the lower redistribution layer and electrically connected to the semiconductor chip and the conductive via through the wiring pattern; and a heat dissipation via passing through the encapsulant and the upper redistribution layer and vertically overlapping the heat spreader layer, wherein a width of the adhesive layer is the same as a width of the semiconductor chip, and a width of the thin film layer is less than a width of the adhesive layer and is the same as a width of the heat spreader layer, and wherein the heat dissipation via contacts a top surface of the heat spreader layer.

19. The semiconductor package of claim 18, wherein a width of the thin film layer is 2 μm to 8 μm less than a width of the adhesive layer and a width of the heat spreader layer is 2 μm to 8 μm less than a width of the adhesive layer.

20. The semiconductor package of claim 18, wherein a thickness of the adhesive layer is about 2 μm to about 8 μm and a thickness of the heat spreader layer is about 2 μm to about 8 μm.

* * * * *